US012787704B2

(12) United States Patent
Tominaga et al.

(10) Patent No.: US 12,787,704 B2
(45) Date of Patent: Nov. 3, 2026

(54) SUBSTRATE PROCESSING APPARATUS AND CONTROL POSITION SETTING METHOD

(71) Applicant: Tokyo Electron Limited, Tokyo (JP)

(72) Inventors: Ryoya Tominaga, Iwate (JP); Akashi Fujio, Iwate (JP); Masami Dodo, Iwate (JP); Gaku Watanabe, Iwate (JP); Hiroyuki Wada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 196 days.

(21) Appl. No.: 18/589,816

(22) Filed: Feb. 28, 2024

(65) Prior Publication Data

US 2024/0297061 A1 Sep. 5, 2024

(30) Foreign Application Priority Data

Mar. 3, 2023 (JP) ................................ 2023-033019

(51) Int. Cl.
*H10P 72/50* (2026.01)
*H10P 72/76* (2026.01)

(52) U.S. Cl.
CPC .......... *H10P 72/53* (2026.01); *H10P 72/7612* (2026.01); *H10P 72/7618* (2026.01); *H10P 72/7621* (2026.01)

(58) Field of Classification Search
CPC .. H10P 72/53; H10P 72/7612; H10P 72/7618; H10P 72/7621; H10P 72/0434; H10P 72/0606; H10P 72/0616; H10P 72/3306; H10P 72/7626; H10P 72/50; C23C 16/45548; C23C 16/4584; C23C 16/52; H01L 21/68742
See application file for complete search history.

(56) References Cited

U.S. PATENT DOCUMENTS

| | | | | |
|---|---|---|---|---|
| 2002/0174950 A1* | 11/2002 | Park | H10P 72/7612 | 118/728 |
| 2007/0193520 A1* | 8/2007 | Kim | H10P 72/7612 | 118/729 |
| 2010/0110408 A1* | 5/2010 | Compen | G03F 7/70516 | 355/72 |
| 2021/0028052 A1* | 1/2021 | So | H01J 37/32715 | |
| 2022/0013388 A1* | 1/2022 | Daugherty | H10P 72/0606 | |

FOREIGN PATENT DOCUMENTS

| | | |
|---|---|---|
| JP | 2015-060936 A | 3/2015 |
| JP | 201705034 A | 3/2017 |
| JP | 2017224792 A | 12/2017 |
| JP | 2019149510 A | 9/2019 |

* cited by examiner

*Primary Examiner* — Alicia M. Choi
(74) *Attorney, Agent, or Firm* — Venjuris, P.C.

(57) ABSTRACT

A substrate processing apparatus includes a vacuum container, a rotary table, a stage, a lifter, and a controller that controls an operation of the lifter. The controller automatically sets a control position in the operation of the lifter. The controller, in (A), repeatedly raises the lifter by a first pitch and then determines whether or not the lifter has come into contact with a substrate, thereby bring the lifter to come into contact with the substrate to set a next position. The controller, in (B), repeatedly raises the lifter from the next position by a second pitch shorter than the first pitch and then determines whether or not the lifter has come into contact with the substrate, thereby detecting a touch position and calculating the control position based on the touch position.

10 Claims, 9 Drawing Sheets

| | | | | | | |
|---|---|---|---|---|---|---|
| DIFFERENCE FROM ACTUAL MEASURED VALUE [mm] | −0.02 | 0.00 | 0.03 | −0.02 | −0.01 | 0.02 |

SUBSTRATE PROCESSING APPARATUS AND CONTROL POSITION SETTING METHOD

CROSS-REFERENCE TO RELATED APPLICATIONS

The present application is based on and claims priority from Japanese Patent Application No. 2023-033019, filed on Mar. 3, 2023, with the Japan Patent Office, the disclosure of which is incorporated herein in its entirety by reference.

TECHNICAL FIELD

The present disclosure relates to a substrate processing apparatus and a control position setting method.

BACKGROUND

Japanese Patent Application Laid-open Publication No. 2015-060936 discloses a substrate processing apparatus including a vacuum container and a rotary table that rotates a plurality of substrates placed thereon within the vacuum container. For example, the substrate processing apparatus performs substrate processing on each substrate placed on the rotary table by supplying a processing gas into the vacuum container while rotating the rotary table.

This type of substrate processing apparatus includes a vertically movable lifter near a transfer port of the vacuum container in order to place the substrates on a plurality of stages of the rotary table. A user of the substrate processing apparatus sets, at the time of startup of the apparatus or during maintenance, control positions for use in the vertical movement of the lifter.

SUMMARY

According to an aspect of the present disclosure, a substrate processing apparatus includes a vacuum container, a rotary table rotatably provided within the vacuum container, a stage that places a substrate thereon at a position away from a rotation center of the rotary table, a lifter that is displaced relative to the stage to raise or lower the substrate, and a controller that controls an operation of the lifter, wherein the controller is configured to automatically set a control position in the operation of the lifter, and wherein, in setting of the control position, the controller controls a process including (A) repeatedly raising the lifter by a first pitch and then determining whether or not the lifter has come into contact with the substrate placed on the stage, thereby detecting a position where the lifter comes into contact with the substrate and setting a next position based on the detected position, and (B) repeatedly raising the lifter from the next position by a second pitch shorter than the first pitch and then determining whether or not the lifter has come into contact with the substrate placed on the stage, thereby detecting a touch position where the lifter comes into contact with the substrate and calculating the control position based on the touch position.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
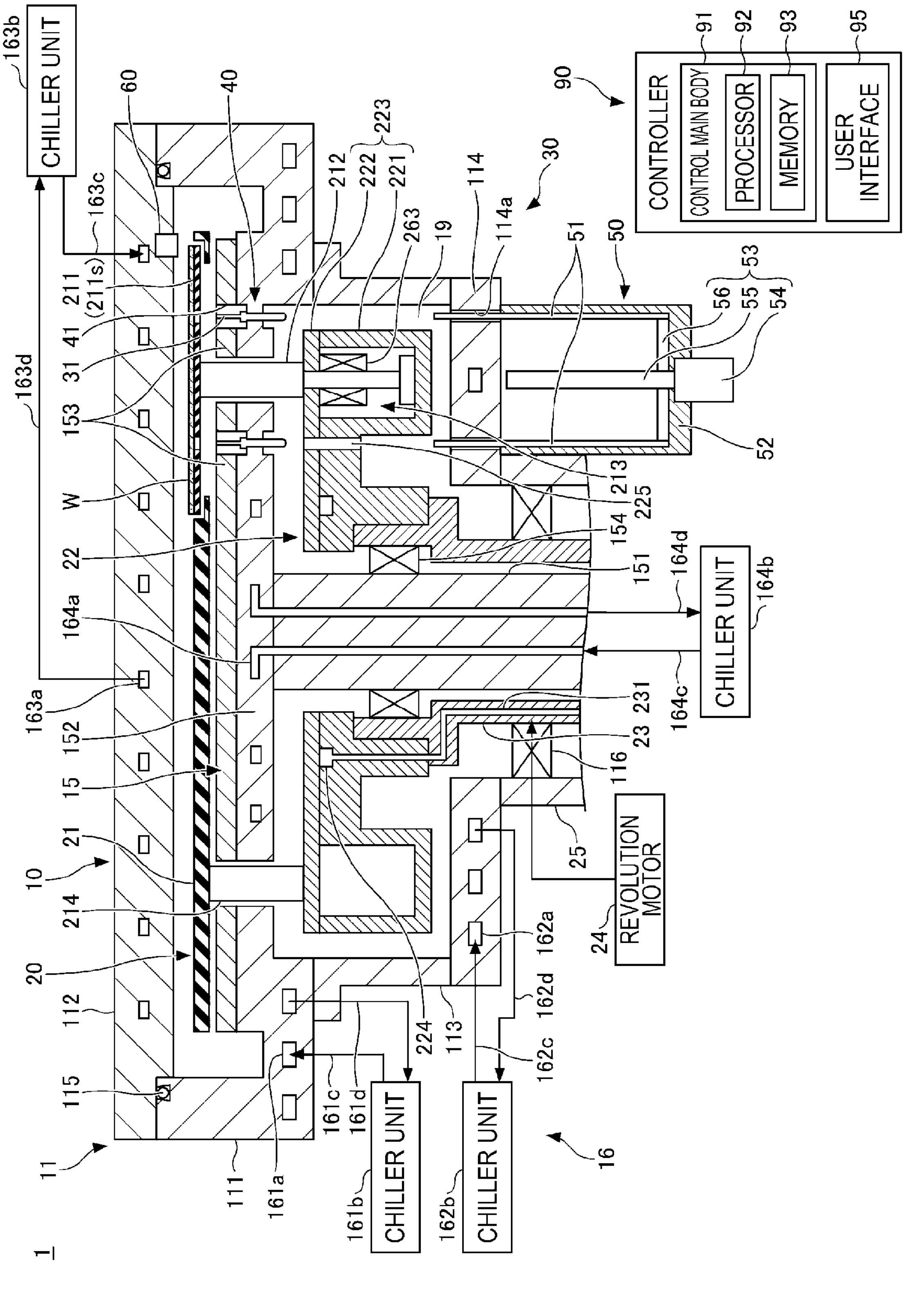
FIG. 1 is a longitudinal cross-sectional view illustrating an example configuration of a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals may be given to the same components, and redundant descriptions may be omitted.

[Configuration of Substrate Processing Apparatus]

Figure 2:
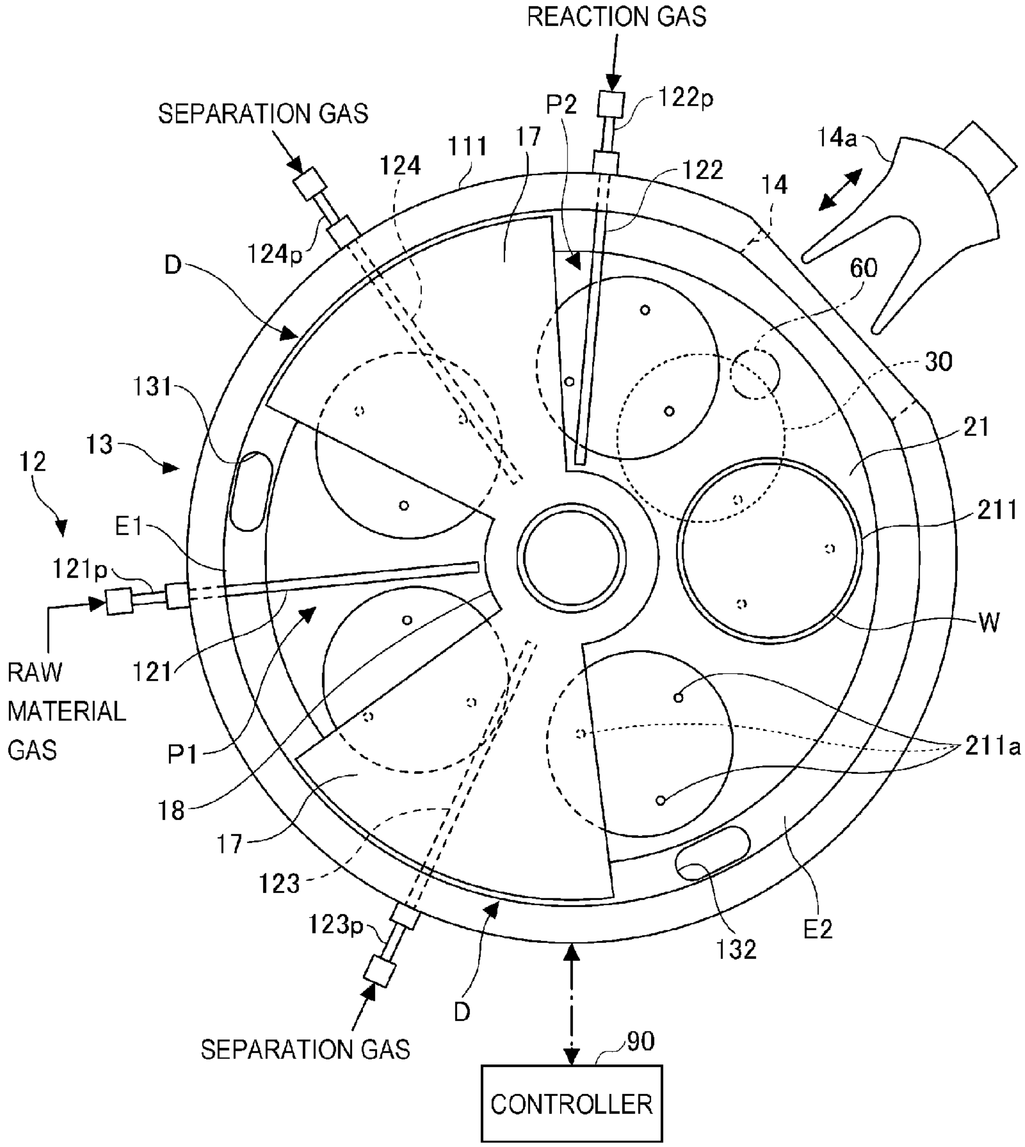
FIG. 2 is a plan view illustrating an internal configuration of a vacuum container of the substrate processing apparatus of FIG. 1.
Figure 3:
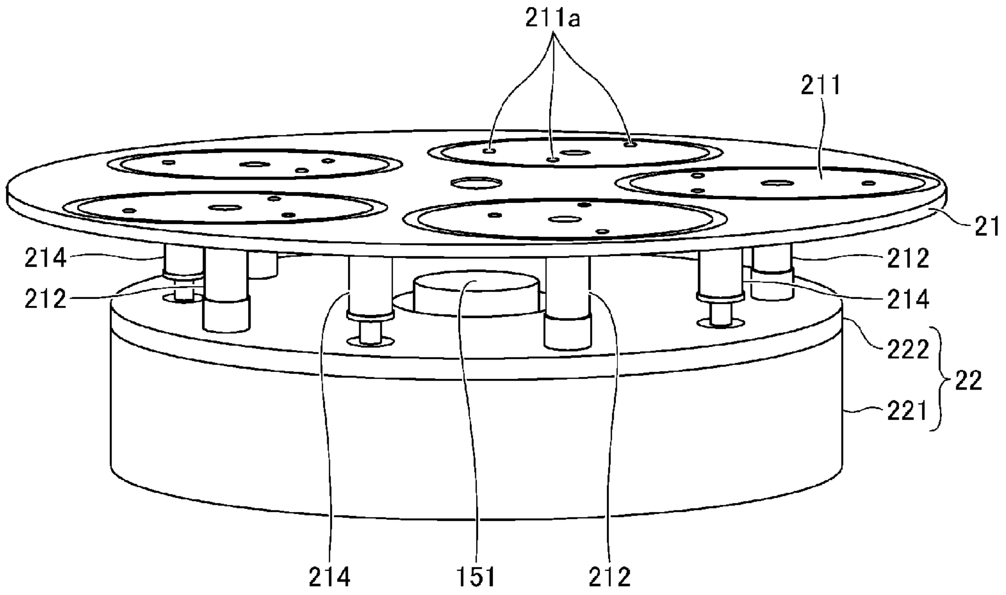
FIG. 3 is a perspective view illustrating a configuration of a rotary table and a stage of the substrate processing apparatus of FIG. 1.

A substrate processing apparatus 1 will be described with reference to FIGS. 1 to 3. FIG. 1 is a longitudinal cross-sectional view illustrating an example configuration of the substrate processing apparatus 1 according to an embodiment. FIG. 2 is a plan view illustrating an internal configuration of a vacuum container 11 of the substrate processing apparatus 1 of FIG. 1. In FIG. 2, for the convenience of description, the illustration of a ceiling plate is omitted. FIG. 3 is a perspective view illustrating a configuration of a rotary table 21 and a stage 211 of the substrate processing apparatus 1 of FIG. 1.

The substrate processing apparatus 1 includes a processing unit 10, a rotational drive device 20, a lifter 30, and a controller 90.

The processing unit 10 executes a film formation processing to form a film on a substrate W. The processing unit 10 includes a vacuum container 11, a gas introduction unit 12, a gas exhaust unit 13, a transfer port 14, a heating unit 15, and a cooling unit 16.

The vacuum container 11 is a processing container with a depressurizable internal space. The vacuum container 11 is formed as a flat case having a substantially circular planar shape and may accommodate a plurality of substrates W in the internal space. The substrates W may be, for example, semiconductor wafers. The vacuum container 11 includes a main body 111, a ceiling plate 112, a sidewall body 113, and a bottom plate 114 (FIG. 1). The main body 111 has a cylindrical shape. The ceiling plate 112 is removably mounted on an upper surface of the main body 111. The main body 111 and the ceiling plate 112 are airtightly in close contact with each other by a seal 115. The sidewall body 113 has a cylindrical shape and is airtightly connected to a lower surface of the main body 111. The bottom plate 114 is airtightly connected to a bottom surface of the sidewall body 113.

The gas introduction unit 12 includes a raw material gas nozzle 121, a reaction gas nozzle 122, and separation gas nozzles 123 and 124 (FIG. 2). The raw material gas nozzle 121, reaction gas nozzle 122, and separation gas nozzles 123 and 124 are arranged, above the rotary table 21 to be described later, at intervals along the circumferential direction of the vacuum container 11 (direction indicated by arrow A in FIG. 2). In the illustrated example, the separation gas nozzle 123, raw material gas nozzle 121, separation gas nozzle 124, and reaction gas nozzle 122 are arranged in this order in the clockwise direction (rotational direction of the rotary table 21) from the transfer port 14. Each of the raw material gas nozzle 121, reaction gas nozzle 122, and separation gas nozzles 123 and 124 has a gas introduction port 121*p*, 122*p*, 123*p*, or 124*p* (FIG. 2) at a base end thereof for introducing various gases. The gas introduction ports 121*p*, 122*p*, 123*p*, and 124*p* are fixed to a sidewall of the main body 111 and protrude outward of the main body 111. The raw material gas nozzle 121, reaction gas nozzle 122, and separation gas nozzles 123 and 124 are inserted into the vacuum container 11 from the sidewall of the main body 111 and extend radially inward of the main body 111. The raw material gas nozzle 121, reaction gas nozzle 122, and separation gas nozzles 123 and 124 are made of, for example, quartz and are arranged parallel to the rotary table 21.

The raw material gas nozzle 121 is connected to a raw material gas source through a pipe, a flow rate controller, etc. (although not illustrated). For example, a silicon-containing gas or metal-containing gas may be used as a raw material gas. The raw material gas nozzle 121 has a plurality of discharge holes (not illustrated), which are open toward the rotary table 21 and are arranged at intervals along the axial direction of the raw material gas nozzle 121. An area below the raw material gas nozzle 121 serves as a raw material gas adsorption area P1 for adsorbing the raw material gas to the substrate W.

The reaction gas nozzle 122 is connected to a reaction gas source through a pipe, a flow rate controller, etc. (although not illustrated). For example, an oxidizing gas or nitriding gas may be used as a reaction gas. The reaction gas nozzle 122 has a plurality of discharge holes (not illustrated), which are open toward the rotary table 21 and are arranged at intervals along the axial direction of the reaction gas nozzle 122. An area below the reaction gas nozzle 122 serves as a reaction gas supply area P2 for oxidizing or nitriding the raw material gas adsorbed onto the substrate W in the raw material gas adsorption area P1. In the present embodiment, a processing gas for processing the substrate W includes the above raw material gas and reaction gas.

Both the separation gas nozzles 123 and 124 are connected to a separation gas source through a pipe, a flow rate control valve, etc. (although not illustrated). For example, an inert gas such as an argon (Ar) gas or nitrogen ($N_2$) gas may be used as a separation gas. The separation gas nozzles 123 and 124 have a plurality of discharge holes (not illustrated), which are open toward the rotary table 21 and are arranged at intervals along the axial direction of the separation gas nozzles 123 and 124.

Further, as illustrated in FIG. 2, two convex sectors 17 are provided within the vacuum container 11. The convex sectors 17 constitute a separation area D in conjunction with the separation gas nozzles 123 and 124, and therefore, are attached to the underside of the ceiling plate 112 to protrude toward the rotary table 21. Each convex sector 17 has a fan-like planar shape with a top portion cut into an arc shape, and is oriented such that an inner arc is connected to a protrusion 18 and an outer arc follows the sidewall of the vacuum container 11.

The gas exhaust unit 13 includes a first exhaust port 131 and a second exhaust port 132 (FIG. 2). The first exhaust port 131 is formed in the bottom of a first exhaust area E1 that communicates with the raw material gas adsorption area P1. The second exhaust port 132 is formed in the bottom of a second exhaust area E2 that communicates with the reaction gas adsorption area P2. The first exhaust port 131 and the second exhaust port 132 are connected to an exhaust device (not illustrated) through an exhaust pipe (not illustrated).

The transfer port 14 is provided on the sidewall of the main body 111 (FIG. 2). The substrate W is transferred through the transfer port 14 between the rotary table 21 inside the vacuum container 11 and a transfer device 14*a* outside the vacuum container 11. The transfer port 14 is opened or closed by a gate valve (not illustrated).

The heating unit 15 includes a fixed shaft 151, a heater support 152, and a heater 153 (FIG. 1).

The fixed shaft 151 has a cylindrical shape with the center of the vacuum container 11 as the central axis. The fixed shaft 151 penetrates the bottom plate 114 of the vacuum container 11 inside a rotating shaft 23 of the rotational drive device 20 to be described later.

The heater support 152 is fixed to an upper end of the fixed shaft 151 and has a disc shape. The heater support 152 supports the heater 153.

The heater 153 is installed to an upper surface of the heater support 152. The heater 153 may also be installed on the main body 111, in addition to the upper surface of the heater support 152. The heater 153 generates heat upon receiving power supplied from a power supply (not illustrated), thus heating the substrate W. Further, the heater 153 may have a shield plate on an upper surface thereof (facing the rotary table 21) to prevent the heater 153 from being exposed to the processing gas.

The cooling unit 16 includes fluid flow paths 161*a* to 164*a*, chiller units 161*b* to 164*b*, inlet pipes 161*c* to 164*c*, and outlet pipes 161*d* to 164*d* (FIG. 1). The fluid flow paths 161*a* to 164*a* are formed respectively within the main body 111, the ceiling plate 112, the bottom plate 114, and the heater support 152. The chiller units 161*b* to 164*b* output a temperature-regulated fluid. The temperature-regulated fluid output from the chiller units 161*b* to 164*b* flows through the inlet pipes 161*c* to 164*c*, the fluid flow paths 161*a* to 164*a*, and the outlet pipes 161*d* to 164*d* in this order for circulation. This allows for the temperature adjustment of the main body 111, the ceiling plate 112, the bottom plate 114, and the heater support 152. For example, a fluorine-based fluid such as Galden (registered trademark) or water may be used as the temperature-regulated fluid.

The rotational drive device 20 includes the rotary table 21, an accommodating box 22, a rotating shaft 23, a revolution motor 24, and an outer cylinder 25.

The rotary table 21 is provided inside the vacuum container 11 and has a rotation center at the center of the vacuum container 11. The rotary table 21 has, for example, a disc shape and is made of quartz. A plurality of (e.g., six) stages 211 are provided on an upper surface of the rotary table 21 along the rotational direction (circumferential direction). The rotary table 21 is connected to the accommodating box 22 via a connector 214 (FIG. 3).

Each stage 211 has a slightly larger disc shape than the substrate W, and is made of, for example, quartz. A placement surface 211*s* for placing the substrate W is formed on an upper surface of each stage 211. Each stage 211 is connected to a rotation motor 213 via a rotation shaft 212 and is configured to be rotatable relative to the rotary table 21 (FIG. 1).

The rotation shaft 212 connects a lower surface of the stage 211 to the rotation motor 213 accommodated in the accommodating box 22 and transmits the power of the rotation motor 213 to the stage 211. The rotation shaft 212 is configured to be rotatable about the center of the stage 211 as a rotation center. The rotation shaft 212 is provided to penetrate a ceiling 222 of the accommodating box 22 and the rotary table 21. A seal 263 is provided near a penetrating portion of the ceiling 222 of the accommodating box 22 to maintain an airtight state inside the accommodating box 22. An example of the seal 263 includes a magnetic fluid seal.

The rotation motor 213 rotates the stage 211 relative to the rotary table 21 via the rotation shaft 212, thereby allowing the substrate W to rotate around the center of the substrate W. For example, a servo motor may be applied as the rotation motor 23.

The connector 214 connects a lower surface of the rotary table 21 to an upper surface of the accommodating box 22 (FIG. 3). A plurality of connectors 214 are arranged along the circumferential direction of the rotary table 21.

The accommodating box 22 is located below the rotary table 21 within the vacuum container 11. The accommodating box 22 is connected to the rotary table 21 via the connectors 214 and rotates integrally with the rotary table 21. The accommodating box 22 may be configured to be vertically movable within the vacuum container 11 by a lifting mechanism (not illustrated). The accommodating box 22 includes a main body portion 221 and a ceiling portion 222.

The main body portion 221 is formed into a concave shape in longitudinal cross-section and has a ring shape along the rotational direction of the rotary table 21 (FIG. 1).

The ceiling portion 222 is provided on an upper surface of the main body portion 221 to cover an opening of the main body portion 221. This allows the main body portion 221 and the ceiling portion 222 to define a rotating compartment 223 isolated from the inside of the vacuum container 11.

The rotating compartment 223 is formed into a rectangular shape in longitudinal cross-section and has a ring shape along the rotational direction of the rotary table 21. The rotating compartment 223 accommodates the rotation motor 213 (rotation source). A communication path 224 is formed in the main body portion 221 to communicate the rotating compartment 223 with the outside of the substrate processing apparatus 1. This allows the atmospheric air to be introduced into the rotating compartment 223 from the outside of the substrate processing apparatus 1, so that the inside of the rotating compartment 223 is cooled and is maintained at atmospheric pressure. In order to rotatably arrange the rotating compartment 223, the vacuum container 11 has a rotation source accommodating space 19 surrounded by the sidewall body 113, bottom plate 114, and heating unit 15.

The rotating shaft 23 is fixed to a lower portion of the accommodating box 22. The rotating shaft 23 is provided to penetrate the bottom plate 114 of the vacuum container 11. The rotating shaft 23 transmits the power of the revolution motor 24 to the rotary table 21 and the accommodating box 22, causing the rotary table 21 and the accommodating box 22 to rotate integrally. A seal 154 is provided between an outer wall of the fixed shaft 151 and an inner wall of the rotating shaft 23 of the rotational drive device 20. This allows the rotating shaft 23 to rotate relative to the fixed shaft 151 while maintaining an airtight state inside the vacuum container 11. For example, a magnetic fluid seal may be applied to the seal 154.

The outer cylinder 25 of the rotational drive device 20 is connected to the lower surface center of the bottom plate 114 of the vacuum container 11. The outer cylinder 25 supports the vacuum container 11 in conjunction with the fixed shaft 151 of the vacuum container 11. A seal 116 is provided between the rotating shaft 23 and the outer cylinder 25 to maintain an airtight state inside the vacuum container 11. For example, a magnetic fluid seal may be applied to the seal 116.

A passage 231 is formed within the rotating shaft 23. The passage 231 is connected to the communication path 224 of the accommodating box 22 and functions as a fluid flow path for introducing the atmospheric air into the accommodating box 22. Further, the passage 231 also functions as a wiring duct for introducing power lines and signal lines into the accommodating box 22 to drive the rotation motor 213. For example, the passage 231 is provided in the same number as the rotation motor 213.

Further, as illustrated in FIG. 1, when the transfer device 14*a* (FIG. 2) loads or unloads the substrate W onto or from the stage 211, the lifter 30 raises or lowers a plurality of (three in the present embodiment) lift pins 31 to receive or transfer the substrate W from or to the transfer device 14*a*. In the substrate processing apparatus 1, the lifter 30 is positioned vertically below a position opposite to the stage adjacent to the transfer port 14. The lifter 30 includes a plurality of (three) upper structures 40, each having a corresponding one of the plurality of lift pins 31, and a single lower actuator 50, which simultaneously raises or lowers the plurality of lift pins 31, within the vacuum container 11. Further, the substrate processing apparatus 1 includes a camera (imaging device) 60 positioned vertically above the position opposite to the stage to capture images of the substrate W transferred onto the stage 211 (FIG. 2).

Each upper structure 40 is provided to penetrate the heater support 152 and the heater 153 and accommodates the lift pin 31 in a displaceable manner. The lower actuator 50 is attached to a lower surface of the bottom plate 114 of the vacuum container 11. The lower actuator 50 has a plurality of (three) plungers 51, which are displaced along the vertical direction to press a lower end 32 of each lift pin 31, respectively. In other words, the lifter 30 has a two-stage structure in which the plurality of lift pins 31, which are movable to come into direct contact the substrate W, and the plurality of plungers 51, which indirectly raise or lower the substrate W via the lift pins 31, are separately provided in the vertical direction.

The lower actuator 50 includes, in addition to each plunger 51, a case 52 and a plunger drive 53. Further, the plunger drive 53 includes a drive source 54, a drive transmitter 55 that transmits the operating force of the drive source 54, and a movable body 56 that supports each plunger 51 and is displaced within the case 52 by the drive transmitter 55.

The case 52 is fixed to the bottom plate 114 at the later side of the outer cylinder 25 and is formed into a suitable shape to accommodate each component of the lower actuator 50. The drive source 54 is installed to the bottom of the case 52 and operates based on the control of the controller 90 to transmit the operating force thereof to the drive transmitter 55. The drive transmitter 55 vertically moves the movable body 56 by appropriately reducing or converting the operating force of the drive source 54. The movable body 56 extends radially outwardly (horizontally) from the drive transmitter 55 and supports a lower end of each plunger 51. The movable body 56 is vertically moved by the drive transmitter 55, thereby integrally displacing each plunger 51.

Further, the drive transmitter 55 includes an encoder (not illustrated) that measures the amount of rotation of the drive source 54 (or the position of the plunger 51), thus detecting the height position of the plunger 51, i.e., the height position of the lift pin 31. This allows the controller 90 to recognize the height position of the lift pin 31. Furthermore, the drive transmitter 55 sets the minimum control unit of each plunger 51 to, for example, 0.05 mm, allowing the lift pin 31 to be raised or lowered in increments of 0.05 mm. The minimum control unit when raising or lowering the lift pin 31 is not limited to 0.05 mm and may be designed arbitrarily.

Each plunger 51 has an elongated solid rod shape and is fixed to the movable body 56, thereby extending in parallel in the vertical direction. The bottom plate 114 has a bottom plate side through-hole **114*a* formed at a location opposite to each plunger 51 to allow the passage of each plunger 51 therethrough. Further, the accommodating box 22 has a box side through-hole 225 formed at a location opposite to each plunger 51 near the rotating shaft 23 to allow the passage of each plunger 51** therethrough.

Each plunger 51 is in a standby state with an upper end thereof slightly protruding from the bottom plate side through-hole **114*a* in the non-operational state of the lift pin 31. Then, each plunger 51 is moved upward together with the movable body 56 to move within the rotation source accommodating space 19 when receiving or transferring the substrate W. Each plunger 51 passes through the side of the accommodating box 22 or the box side through-hole 225 to come into contact with the lift pin 31 of each upper structure 40, thereby pushing up the lift pin 31**.

Figure 4:
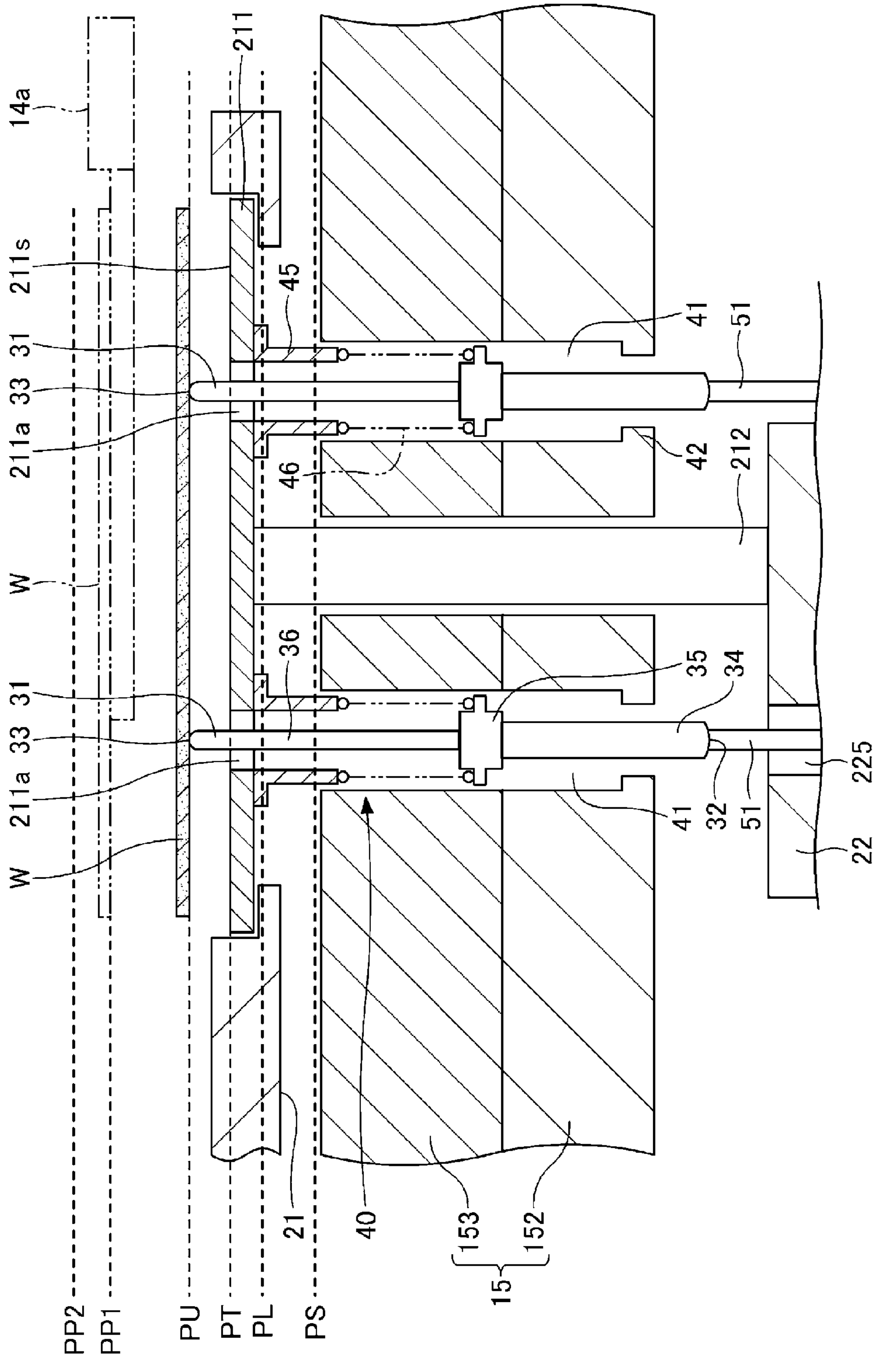
FIG. 4 is an enlarged partial cross-sectional view illustrating the periphery of each upper structure of a lifter of FIG. 1.

FIG. 4 is an enlarged partial cross-sectional view illustrating the periphery of each upper structure 40 of the lifter 30 of FIG. 1. In FIG. 4, two lift pins 31 and two upper structures 40 are illustrated as representative. Each upper structure 40 includes the lift pin 31, a receptacle 41 for accommodating the lift pin 31 in a lifting manner, and a cylinder member 45 located in an upper region of the receptacle 41 so as to be displaced simultaneously with the lift pin 31.

The plurality of (three) upper structures 40 are arranged in the circumferential direction of the stage 211 at positions with a spacing in the radial direction from the rotation shaft 212. The stage 211 includes a plurality of (three) through-holes **211*a* to allow the passage of each lift pin 31 therethrough at positions corresponding to the respective upper structures 40 (see also FIG. 2**).

The lift pin 31 is a linearly extending cylindrical member and has the lower end 32 and an upper end 33. The lower end 32 of the lift pin 31 is located below a lower surface of the heater support 152 when the plunger 51 is at a downwardly moved position. The upper end 33 of the lift pin 31 is moved vertically higher than the heater 153 when pressed by the plunger.

The upper structure 40 is configured to support the lift pin 31 accommodated in the receptacle 41 to prevent the lift pin 31 from being detached in a vertical downward direction. For example, the lift pin 31 has a lower rod portion 34, a flange forming portion 35, and an upper rod portion 36 in this order from the bottom to the top. The lower rod portion 34, flange forming portion 35, and upper rod portion 36 are integrally molded with each other.

The lower rod portion 34 is formed thicker than the upper rod portion 36, increasing the area of the lower end 32. The plunger 51 raised by the lower actuator 50 comes into contact with the lower end 32 to push up the lower end 32, thereby raising the entire lift pin 31. The flange forming portion 35 is caught by an inner protrusion 42 provided on an inner wall constituting the receptacle 41, thereby restricting the lift pin 31 from being removed from a standby position PS to be described later. The upper rod portion 36 extends linearly from the flange forming portion 35 to the upper end 33. The upper end 33 is formed in a substantially hemispherical shape to come into point contact with the substrate W.

The receptacle 41 for accommodating the lift pin 31 is vertically formed through the heating unit 15 and is provided with the inner protrusion 42 at a lower side in the vertical direction. The receptacle 41 may be configured by mounting a cylindrical blanket (not illustrated), which is formed separately from the heating unit 15, into a bore.

The cylinder member 45 takes the form of a cylinder that may be positioned inside an upper region of the receptacle 41, and the upper rod portion 36 of the lift pin 31 is positioned within the cylinder member 45. The cylinder member 45 is supported by a coil spring 46, which is in turn supported by an upper surface of the flange forming portion 35. The cylinder member 45 is movable relative to the receptacle 41, and is pushed upward by the coil spring 46 when the lift pin 31 is raised, thereby being raised together with the lift pin 31. The raised cylinder member 45 comes into contact with the underside of the stage 211, allowing communication between the through-hole **211*a* of the stage 211 and the receptacle 41. When the cylinder member 45 comes into contact with the stage 211, the cylinder member 45 stops to be raised, while the lift pin 31 continues to be raised relative to the cylinder member 45. This allows the lift pin 31 to pass through the through-hole 211*a*, protruding upward of the stage 211** to support the substrate W.

FIG. 4 illustrates a configuration in which each lift pin 31 is supported along the vertical direction, but each upper structure 40 may support each lift pin 31 in an inclined posture so that an upper end thereof approaches the rotating shaft 23 (revolution shaft) of the rotary table 21. This allows each upper structure 40 to be obliquely raised in the direction toward the rotating shaft 23 when each lift pin 31 is raised. In other words, each lift pin 31 is raised to approach the substrate W, which has been moved radially outward due to centrifugal force during rotation of the rotary table 21, toward the center of the rotating shaft 23, helping to avoid friction between the rotary table 21 and the substrate W, and preventing the generation of particles.

In the meantime, the camera 60 is installed to the ceiling plate 112 at a position adjacent to the transfer port to capture images of the stage 211 revolving (rotating) within the vacuum container 11. The imaging direction of the camera 60 is not limited to the vertical downward direction but may be inclined with respect to the vertical direction. The camera 60, under the control of the controller 90, captures images of a part (or all) of the inner edge of the stage 211 and a part (or all) of the outer edge of the substrate W placed on the stage 211, transmitting the resulting imaging information to the controller 90.

Returning to FIG. 1, the controller 90 controls each component of the substrate processing apparatus 1. The controller 90 includes a control main body 91 and a user interface 95. The control main body 91 is a computer having one or more processors 92, a memory 93, an input/output interface (not illustrated) and a communication interface (illustrated). The one or more processors 92 include one or a combination of two or more of a central processing unit (CPU), graphics processing unit (GPU), application specific integrated circuit (ASIC), field-programmable gate array (FPGA), a circuit including a plurality of discrete semiconductors, and others, and executes programs stored in the memory 93. The memory 93 includes a non-volatile memory and a volatile memory (e.g., compact disk, digital versatile disc (DVD), hard disk, flash memory, etc.).

Further, the user interface 95 is connected to the input/output interface of the control main body 91. This user interface 95 is not particularly limited, but may include, for example, a touch panel, monitor, keyboard, mouse, etc.

The controller 90 controls each component of the substrate processing apparatus 1, thereby controlling the reception of the substrate W from the transfer device 14*a* (FIG. 2) to each stage 211, the processing of each substrate W, the transfer of the substrate W from each stage 211 to the transfer device 14*a*, etc. For example, when receiving the substrate W, the controller 90 controls the stage 211, which is intended for placing the substrate W, so as to be positioned adjacent to the transfer port 14 of the vacuum container 11. Then, after advancing the transfer device 14*a* from the transfer port 14, the controller 90 operates the lifter 30 to raise each lift pin 31 from the stage 211, thus receiving the substrate W from the transfer device 14*a*. After retreating the transfer device 14*a*, the controller 90 lowers each lift pin 31 to place the substrate W on the stage 211. Further, by sequentially replacing the stage 211 adjacent to the transfer port 14 through the rotation of the rotary table 21, the controller 90 repeats the above operation, thereby placing the substrate Won each stage 211.

During substrate processing, the controller 90 depressurizes the vacuum container 11 to a predetermined internal pressure and controls the heating unit 15 to heat each substrate W. Furthermore, the controller 90 rotates each stage 211 around the rotation shaft 212 while rotating the rotary table 21 around the rotating shaft 23. In this state, the controller 90 controls the gas introduction unit 12 to supply the raw material gas through the raw material gas nozzle 121, to supply the reaction gas through the reaction gas nozzle 122, and to supply the separation gas through the separation gas nozzles 123 and 124, thereby forming a desired film on a surface of each substrate W.

In the transfer of the substrate W after substrate processing, the controller 90 positions the stage 211 for the transfer of the substrate W adjacent to the transfer port 14 of the vacuum container 11, and then, raises each lift pin 31 of the lifter 30 to lift the substrate W from the stage 211. Then, after the entry of the transfer device 14*a*, the controller 90 transfers the substrate W to the transfer device 14*a* by lowering each lift pin 31. This allows the transfer device 14*a* to unload the substrate W from the vacuum container 11. Further, by sequentially replacing the stage 211 adjacent to the transfer port 14 through the rotation of the rotary table 21, the controller 90 repeats the above operation, thereby unloading each substrate W from each stage 211.

Further, when each lift pin 31 is raised or lowered by the lifter 30, the controller 90 controls the operation of each lift pin 31 based on the previously recognized control positions of each lift pin 31. As illustrated in FIG. 4, the control positions of each lift pin 31 include the standby position PS, touch position PT, load position PL, unload position PU, transfer device support position PP1, and lifting upper limit position PP2.

The standby position PS is a position where each lift pin 31 is waiting during the substrate processing of the substrate processing apparatus 1. For example, in the standby position PS, the upper end 33 of each lift pin 31 is set to a position where it slightly protrudes from an upper surface of the heater 153. This allows the lifter 30 to shorten the distance when raising each lift pin 31 to receive or transfer the substrate W before or after substrate processing, thereby improving processing efficiency. The standby position PS may be mechanically defined by the configuration of the lift pin 31 and the receptacle 41, or may be set by the controller 90 controlling the lifter 30.

The touch position PT is a position where the upper end 33 of each lift pin 31, which has been raised, comes into contact with the substrate W placed on the stage 211. Thus, the touch position PT may be rephrased as the height position of the placement surface 211*s* of the stage 211. Here, the height positions of the plurality of placement surfaces 211*s* (stages 211) may slightly differ from each other due to a slight inclination, mechanical dimensional tolerances, etc. of the rotary table 21. It may be necessary for the controller 90 to recognize the touch position PT at each stage 211 and to set other control positions (load position PL, unload position PU, etc.) based on the touch position PT, thereby operating the lifter 30 accordingly. Therefore, in a control position setting method for the lifter 30, the controller 90 detects the touch position PT where the raised lifter 30 comes into contact with the substrate W, and calculates other control positions based on the touch position PT. The control position setting method for the lifter 30 will be described later.

In the meantime, the load position PL is set lower than the placement surface 211*s* of the stage 211 (i.e., the touch position PT). For example, the load position PL is set lower than the touch position PT in the vertical direction by an appropriate interval within the range of 0.3 mm to 0.9 mm. This load position PL may be set based on the unload position PU.

When controlling the lifter 30, the controller 90 recognizes the height position of the plunger 51 based on the detection of the encoder, and determines whether or not the upper end 33 of each lift pin 31 has reached the load position PL, thereby switching the speed of each lift pin 31 at the load position PL. In other words, the load position PL is used as the control position for switching the speed of each lift pin 31. For example, when raising each lift pin 31, the controller 90 reduces the rising speed of each lift pin 31 based on the fact that the upper end 33 has been raised to the load position PL. Conversely, when lowering each lift pin 31, the controller 90 increases the lowering speed of each lift pin 31 based on the fact that the upper end 33 has been lowered to the load position PL.

The unload position PU is set higher than the placement surface 211*s* of the stage 211 (i.e., the touch position PT). For example, the unload position PU is set higher than the touch position PT in the vertical direction by an appropriate interval within the range of 0.4 mm to 1.0 mm. The unload position PU is above the stage 211, and the substrate W supported by each lift pin 31 is present at this unload position Pu. In order to prevent any influence such as the warping of the substrate W supported by each lift pin 31, the distance between the touch position PT and the unload position PU may be set longer than the distance between the touch position PT and the load position PL.

When controlling the lifter 30, the controller 90 determines whether or not the upper end 33 of each lift pin 31 has reached the unload position PU, thereby switching the speed of each lift pin 31 at this unload position PU. In other words, the unload position PU is also used as the control position for switching the speed of each lift pin 31. For example, when raising each lift pin 31, the controller 90 increases the rising speed of each lift pin 31 based on the fact that the upper end 33 has been raised to the unload position PU. Conversely, when lowering each lift pin 31, the controller 90 reduces the lowering speed of each lift pin 31 based on the fact that the upper end 33 has been lowered to the unload position PU.

Further, the transfer device support position PP1 is a position where the transfer device 14*a* supports the substrate W when it enters the vacuum container 11. In other words, the transfer device support position PP1 corresponds to the support surface of an end effector of the transfer device 14*a*. This transfer device support position PP1 is not a relative position set based on the touch position PT, but a preset fixed value for controlling the transfer device 14*a*. Once the upper end 33 of each lift pin 31 is raised to the transfer device support position PP1 in a state where the transfer device 14*a* supports the substrate W, the lift pin 31 may receive the substrate W. Once the upper end 33 of each lift pin 31 supporting the substrate W is lowered to the transfer device support position PP1 in a state where the transfer device 14*a* is empty, the lift pin 31 may deliver the substrate W to the transfer device 14*a*.

The lifting upper limit position PP2 is the limit position when each lift pin 31 (upper end 33) is raised, and is defined by mechanical elements of the lifter 30 or under the control of the controller 90. The lifting upper limit position PP2 is a fixed value set at a position vertically spaced apart upward from the transfer device support position PP1 by a certain distance. After receiving the substrate W supported by the transfer device 14*a*, the controller 90 raises each lift pin 31 until the upper end 33 reaches the lifting upper limit position PP2, thereby ensuring smooth retreat of the transfer device 14*a*. Further, the controller 90 raises each lift pin 31 supporting the substrate W until the lift pin 31 reaches the lifting upper limit position PP2, thereby allowing the transfer device 14*a* to smoothly enter below the substrate W in the vertical direction.

The controller 90 sets the control positions (touch position PT, load position PL, and unload position PU) used when controlling the lifter 30 by executing a control position setting method for the lifter 30. The control position setting method for the lifter 30 is executed after the installation of the substrate processing apparatus 1 or after maintenance (such as replacement, repairs, etc. of components of the apparatus). Next, the control position setting method for the lifter 30 will be described.

[Control Position Setting Method]

Figure 5:
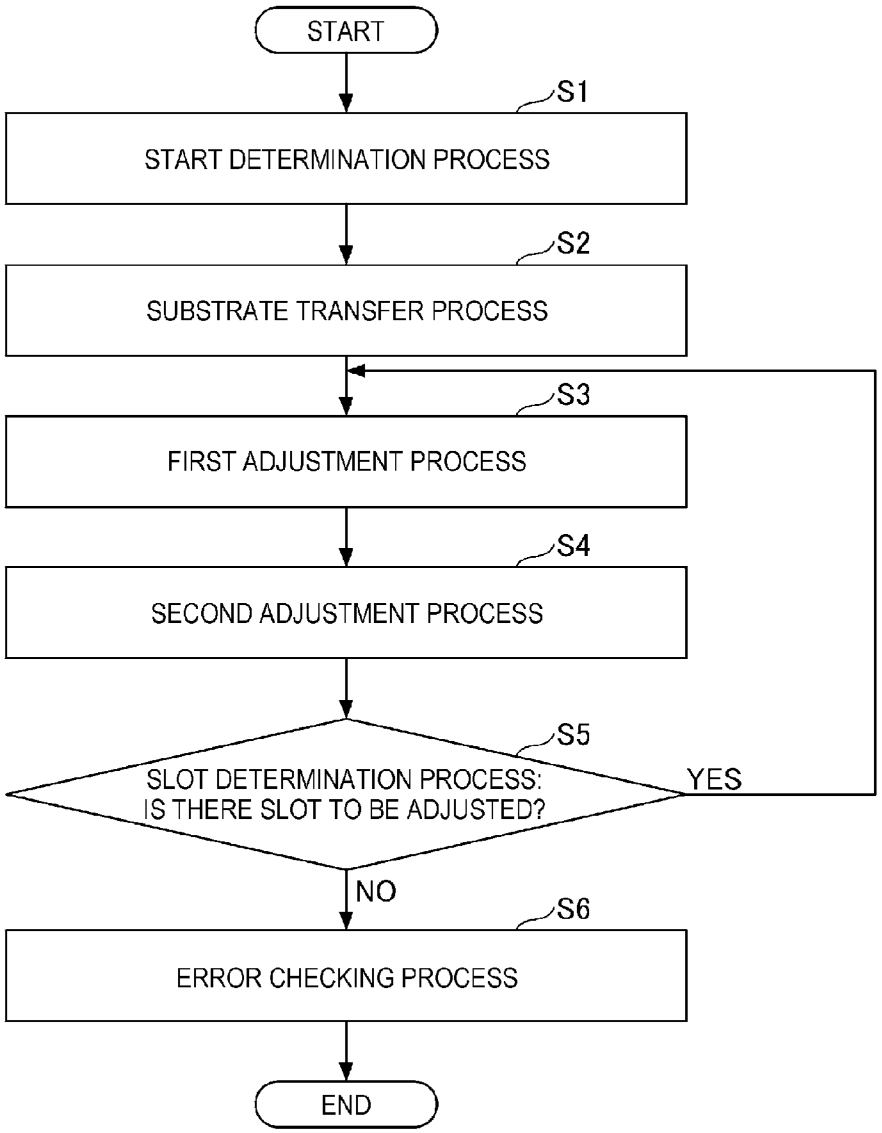
FIG. 5 is a flowchart illustrating the processing flow of a control position setting method for the lifter.

FIG. 5 is a flowchart illustrating the processing flow of a control position setting method for the lifter 30. As illustrated in FIG. 5, in the control position setting method for the lifter 30, the controller 90 controls a start determination process S1, a substrate transfer process S2, a first adjustment process S3, a second adjustment process S4, a slot determination process S5, and an error checking process S6 in this order.

In the start determination process S1, the controller 90 determines whether or not a trigger condition to start the control position setting method has been satisfied, and when the trigger condition is satisfied, transitions to control after the first adjustment process S3. This trigger condition may involve the user operating the execution of the control position setting method through the user interface 95 connected to the controller 90.

Figure 6:
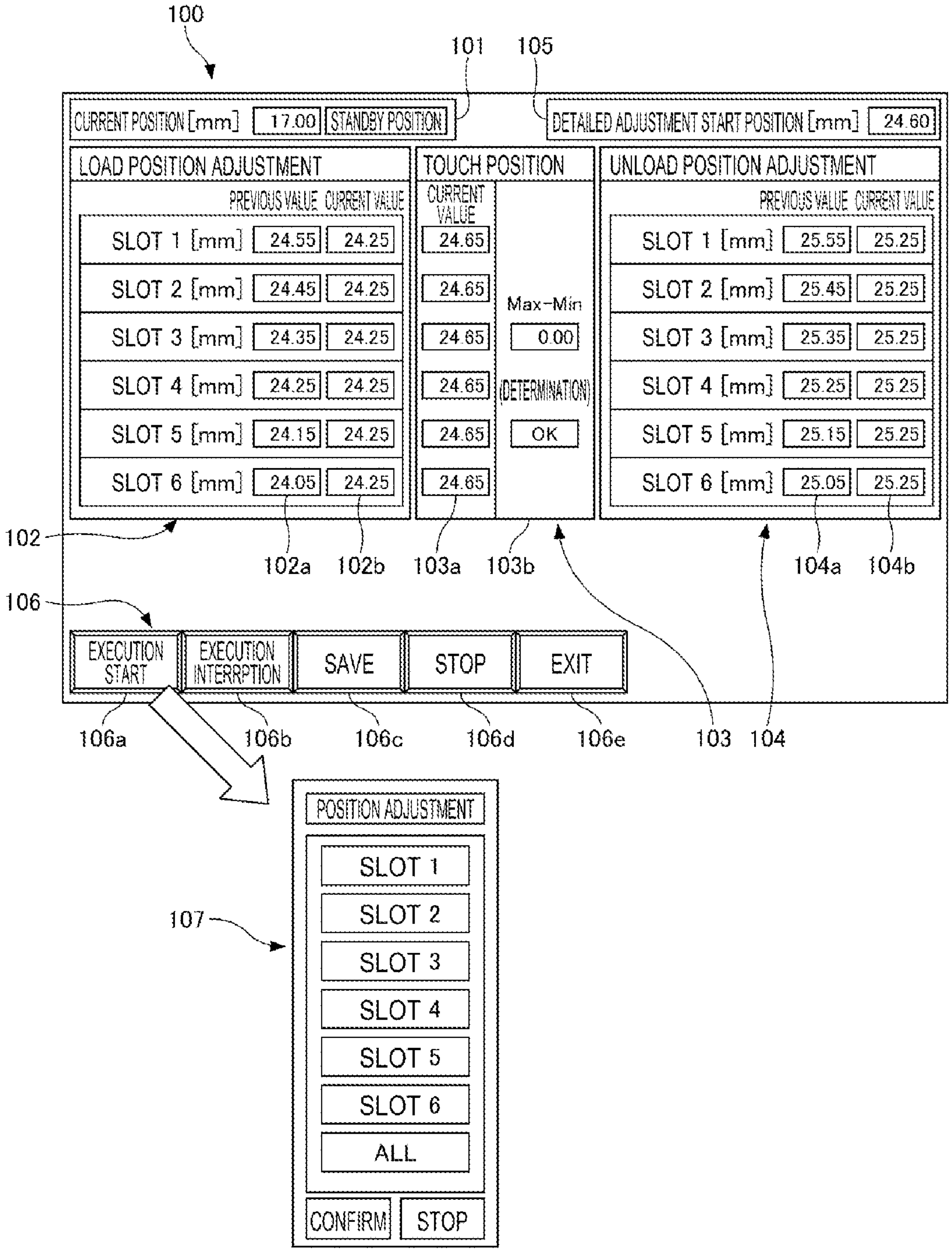
FIG. 6 is a diagram illustrating an example of screen information displayed on a user interface.

FIG. 6 is a diagram illustrating an example of screen information 100 displayed on the user interface 95. In the start determination process S1, the controller 90 displays, for example, the screen information 100 as illustrated in FIG. 6 under the user's operation using the user interface 95. The screen information 100 includes a current position display section 101, a load position display section 102, a touch position display section 103, an unload position display section 104, a detailed adjustment start position display section 105, and an operation button group 106.

The current position display section 101 is a display area indicating the current position of the upper end 33 of the lift pin 31. For example, the current position display section 101 displays the current position of the upper end 33 in millimeters as well as other information such as the name of a position corresponding to the current position.

The load position display section 102 is a display area indicating the load position PL for each of a plurality of slots (stages 211). For example, the load position display section 102 includes a previous value display column 102*a*, which displays the load position PL set at the previous time for each slot, and a current value display column 102*b* positioned adjacent to the previous value display column 102*a*, which displays the load position PL set at the current time for each slot. By displaying the previous value display column 102*a* and the current value display column 102*b* side by side, it becomes easier for the user to recognize a change in the values set during the current control position setting method.

The touch position display section 103 is a display area indicating the touch position PT for each of the plurality of slots (stages 211). For example, the touch position display section 103 includes a current value display column 103*a*, which displays the touch position set at the current time, and a touch position status column 103*b* positioned adjacent to the current value display column 103*a*, which displays information regarding the touch positions between the slots.

For example, the touch position status column 103*b* displays the difference between the maximum and minimum values of the touch positions PT for each slot, and also displays, based on the calculated difference, the presence or absence of an abnormality in each stage 211. In other words, if the difference between the touch positions PT for each slot is large, there is a possibility that an abnormality occurred in the installation state of the stages 211 from the first. Therefore, the controller 90 compares the difference between the touch positions PT for each slot with a preset threshold thereof, and determines normality when the difference is less than the threshold, but determines an abnormality and displays (notifies) the result when the difference is equal to or greater than the threshold.

The unload position display section 104 is displayed in the same manner as the load position display section 102 and is a display area indicating the unload position PU for each of the plurality of slots (stages 211). For example, the unload position display section 104 includes a previous value display column 104*a*, which displays the unload position PU set at the previous time for each slot, and a current value display column 104*b* positioned adjacent to the previous value display column 104*a*, which displays the unload position PU set at the current time for each slot. By displaying the previous value display column 104*a* and the current value display column 104*b* side by side, it becomes easier for the user to recognize a change in the values set during the current control position setting method.

The detailed adjustment start position display section 105 is a display area indicating a detailed adjustment start position (next position) set in the first adjustment process S3 of the control position setting method for the lifter 30. This detailed adjustment start position will be explained in detail later.

In the meantime, the operation button group 106 is an area that displays a row of buttons that are operable by the user. The buttons in the operation button group 106 may include, for example, an execution button 106*a*, execution interruption button 106*b*, save button 106*c*, stop button 106*d*, and exit button 106*e*.

The execution button 106*a* is a button for operating the execution of the control position setting method for the lifter 30. When the user presses the execution button 106*a*, as illustrated in FIG. 6, the controller 90 displays a separate window 107 indicating selection boxes for selecting one or more of the plurality of slots (stages 211) and a selection box for selecting all the slots. In this separate window 107, the user determines the slot for which the control position setting method will be performed by selecting the appropriate selection box. After this determination, the controller 90 starts the control position setting method based on the user's settings.

Further, the execution interruption button 106*b* is a button for interrupting the control position setting method in the middle of execution. The save button 106*c* is a button for saving the touch position PT, load position PL, and unload position PU set at the current time, enabling the operation of the lifter 30 based on these positions. The stop button 106*d* is a button for terminating the control position setting method without saving the touch position PT, load position PL, and unload position PU set at the current time. The exit button 106*e* is a button for terminating the display of the screen information 100 (i.e., the control position setting method).

In other words, in the start determination process S1 illustrated in FIG. 5, the controller 90 sequentially controls each process after the substrate transfer process S2 based on the user pressing the execution button 106*a* of the screen information 100. The controller 90 may automatically execute the control position setting method regardless of the user's operation, for example, within the flow of various settings performed after the installation of the substrate processing apparatus 1 or after maintenance.

In the next substrate transfer process S2, the controller 90 transfers the substrate W to each stage 211 for which the control position setting method will be performed. The substrate W for use in the control position setting method may be a dummy substrate. For example, when executing the control position setting method for all the slots (stages 211), the controller 90, while changing the position of each stage 211 of the rotary table 21, transfers the substrate W using the transfer device 14*a* to place the substrate W on all the stages 211. The operation of the lifter 30 at this time may utilize the previous control position values or a default control position. In the meantime, when executing the control position setting method for only the slot specified by the user, the controller 90 may rotate the rotary table 21 to place the substrate Won the target stage 211.

Figure 7:
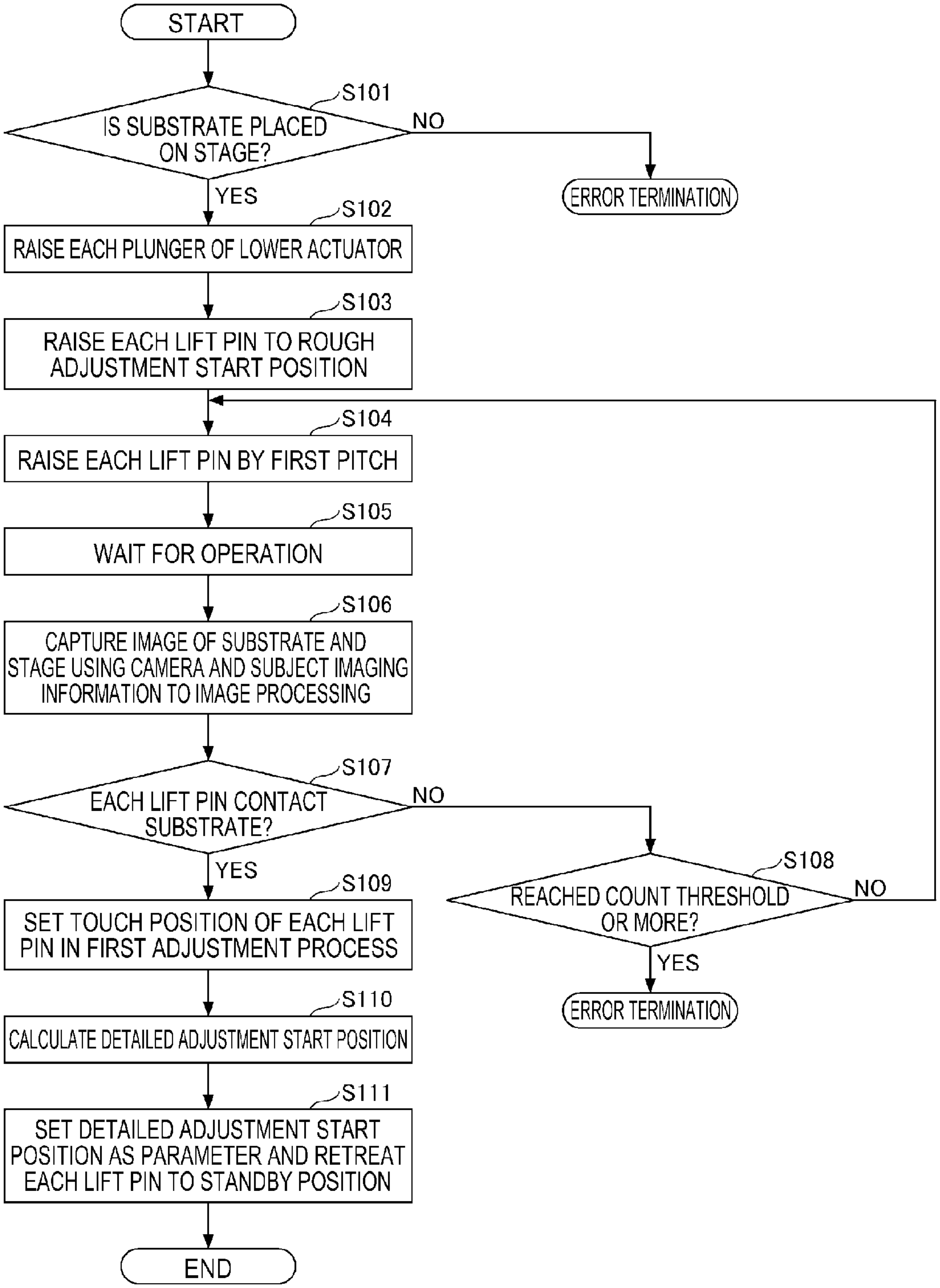
FIG. 7 is a flowchart illustrating the processing flow of a first adjustment process.
Figure 8:
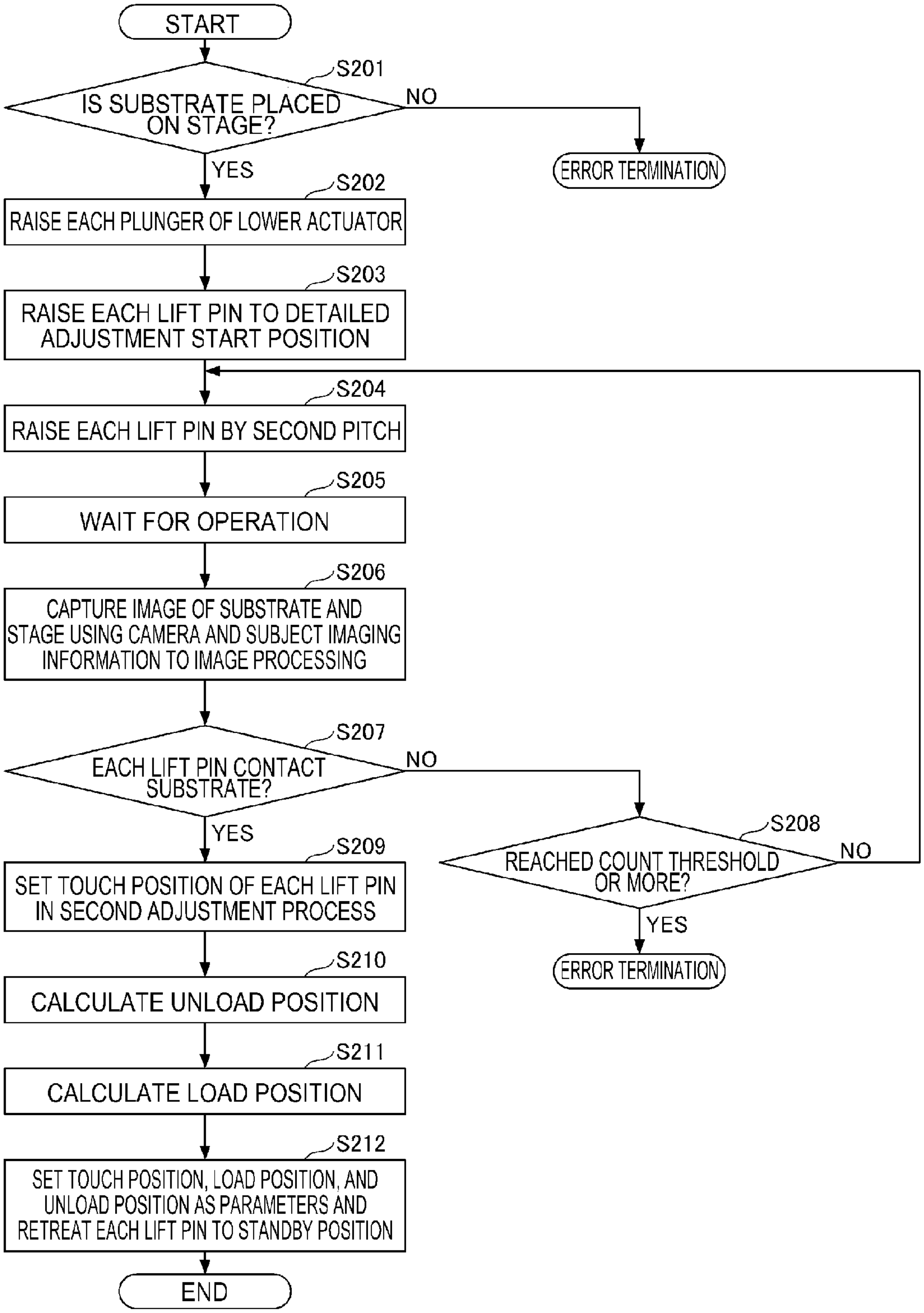
FIG. 8 is a flowchart illustrating the processing flow of a second adjustment process.

Then, in the first adjustment process S3, the controller 90 roughly sets the touch position PT where each lift pin 31 of the lifter 30 comes into contact with the substrate W. Furthermore, in the second adjustment process S4, the controller 90 sets the more detailed touch position PT compared to the touch position PT set in the first adjustment process S3. Hereinafter, the first adjustment process S3 and second adjustment process S4 will be described with reference to FIGS. 7 and 8. FIG. 7 is a flowchart illustrating the processing flow of the first adjustment process S3. FIG. 8 is a flowchart illustrating the processing flow of the second adjustment process S4.

In the first adjustment process S3, the controller 90 controls the operations in steps S101 to S111 illustrated in FIG. 7. First, the controller 90 determines whether or not the substrate W is placed on the stage 211 (slot where the control position is to be set) opposite to the lifter 30 (step S101). For example, the controller 90 captures images of the stage 211 using the camera 60 and determines whether or not the substrate W is included in the captured information, thereby determining the presence or absence of the substrate W on the stage 211. Then, if there is no substrate W on the stage 211 (step S101: NO), the controller 90 notifies an error indicating the absence of the substrate W, and terminates the current control position setting method. In the meantime, when there is the substrate Won the stage 211 (step S101: YES), the controller 90 proceeds to step S102.

In step S102, the controller 90 operates the lower actuator 50 to raise each plunger 51, moving the upper end of each plunger 51 to a position where it comes into contact with the lower end 32 of each lift pin 31. This allows each lift pin 31 to be ready to rise immediately from the standby position PS within the receptacle 41.

Next, the controller 90 operates the lower actuator 50 to raise the upper end 33 of each lift pin 31 to a rough adjustment start position (step S103). This rough adjustment start position is the start position for a first adjustment operation of raising each lift pin 31 in increments of a first pitch and is preset in the controller 90. For example, the rough adjustment start position may be set to be lower than the previous unload position PU by a predetermined separation distance (e.g., 1 mm). The rough adjustment start position may be configured for user setting using the user interface 95. Alternatively, the user may also set the separation distance.

Once the upper end 33 reaches the rough adjustment start position, the controller 90 starts the determination of contact of the substrate W based on the first adjustment operation and the imaging information from the camera 60. Specifically, the controller 90 raises each lift pin 31 by a preset first pitch (step S104). The first pitch is not particularly limited, but may be set to, for example, be at least twice the minimum control unit for raising or lowering each lift pin 31. For example, in case of a mechanism where the lifter 30 raises or lowers each lift pin 31 in increments of 0.05 mm, setting the first pitch to 0.1 mm may be considered.

Once each lift pin 31 is raised by the first pitch, the controller 90 waits for the operation over a certain period (step S105). This eliminates any instability during the rising of each lift pin 31. After that, the controller 90 captures images of the substrate W and the stage 211 using the camera 60. By subjecting the imaging information to appropriate image processing, the controller 90 may extract information on the substrate W and information on the stage 211 from the imaging information (step S106).

Then, the controller 90 determines whether or not the upper end 33 of each lift pin 31 has come into contact with the substrate W based on the information on the substrate W and the information on the stage 211 acquired from the imaging information (step S107). A method for determining the contact between each lift pin 31 and the substrate W may be, for example, to monitor the shadow of the outer edge of the substrate W in the imaging information. In other words, when the substrate W is placed on the placement surface 211*s*, there is almost no shadow around the outer edge of the substrate W. In contrast, when the substrate W is even slightly raised from the placement surface 211*s*, the shadow around the outer edge of the substrate W becomes more pronounced. Therefore, the controller 90 may determine that the substrate W has been raised by each lift pin 31 based on a change in the shadow (black and white binarized pixels acquired through image processing) around the outer edge of the substrate W.

When it is determined that the upper end 33 of each lift pin 31 has not come into contact with the substrate W (step S107: NO), the controller 90 proceeds to step S108. In step S108, the controller 90 counts (increments) the number of executions of the first adjustment operation of raising each lift pin 31 and determines whether or not the count has reached a preset count threshold or more. When the count has reached the count threshold or more, it indicates that even though each lift pin 31 reaches a position where it is supposed to reliably come into contact with the substrate W, the lift pin 31 has not come into contact with the substrate W. In this case, there is a possibility that the lifter 30 has an abnormality. Therefore, when the count has reached the count threshold or more (step S108: YES), the controller 90 notifies an error in the lifter 30 and terminates the current control position setting method.

In the meantime, when the count has not reached the count threshold or more (step S108: NO), the controller 90 returns to step S104 and raises each lift pin 31 again by the first pitch. The controller 90 repeats the above processing flow of steps S104 to S108 until each lift pin 31 comes into contact with the substrate W, thereby ensuring reliable determination of the contact between each lift pin 31 and the substrate W. Then, when it is determined that the upper end 33 of each lift pin 31 has come into contact with the substrate W (step S107: YES), the controller 90 proceeds to step S109.

In step S109, the controller 90 sets the current position of each lift pin 31 as the touch position PT for each lift pin 31 in the first adjustment process S3.

Then, the controller 90 calculates the detailed adjustment start position (next position) in the second adjustment process S4 using the current position of each lift pin (step S110). The detailed adjustment start position is calculated, for example, by adding a preset offset value to the current position (touch position PT) of each lift pin 31 in the first adjustment process S3. This offset value is set to a value (negative value) that lowers the detailed adjustment start position below the current position in the vertical direction. For example, when the first pitch was set to 0.1 mm, the offset value may be set within the range of approximately −0.1 mm to −0.3 mm. This allows the detailed adjustment start position to be slightly lower than the current position, enhancing the processing efficiency of the next second adjustment process S4. The offset value may be arbitrarily set by the user.

After step S110, the controller 90 sets the calculated detailed adjustment start position as a parameter for the next second adjustment process S4 and retreats each lift pin 31 to the standby position PS (step S111). This terminates the first adjustment process S3. Further, when setting the detailed adjustment start position, the controller 90 displays the set detailed adjustment start position in the detailed adjustment start position display section 105 of the screen information 100, as illustrated in FIG. 6. The controller 90 may allow the user to input (update) the detailed adjustment start position into the detailed adjustment start position display section 105, and may implement the second adjustment process S4 based on the detailed adjustment start position set by the user. For example, the user may input the detailed adjustment start position based on the previous value of the touch position PT.

After completing the above first adjustment process S3, the controller 90 transitions to the second adjustment process S4, controlling the operations in steps S201 to S212 illustrated in FIG. 8. Steps S201 and S202 are the same processing as steps S101 and S102 in the first adjustment process S3. Since the substrate W is reliably placed on the stage 211 after going through the first adjustment process S3, the controller 90 may omit step S201.

In step S203, the controller 90 operates the lower actuator 50 to raise the upper end 33 of each lift pin 31 to the detailed adjustment start position set in the first adjustment process S3. Once the upper end 33 reaches the detailed adjustment start position, the controller 90 starts the determination of contact of the substrate W based on the second adjustment operation and the imaging information from the camera 60.

For example, the controller 90 raises each lift pin 31 by a preset second pitch (step S204). The second pitch may be set as the minimum control unit for raising or lowering each lift pin 31, for example. For example, in case of a mechanism where the lifter 30 raises or lowers each lift pin 31 in increments of 0.05 mm, the second pitch may be set to 0.05 mm.

Once each lift pin 31 has been raised by the second pitch, the controller 90 waits for the operation over a certain period (step S205). This eliminates any instability during the rising of each lift pin 31. After that, the controller 90 captures images of the substrate W and the stage 211 using the camera 60. By subjecting the imaging information to appropriate image processing, the controller 90 may extract information on the substrate W and information on the stage 211 from the imaging information (step S206).

Then, the controller 90 determines whether or not the upper end 33 of each lift pin 31 has come into contact with the substrate W based on the information on the substrate W and the information on the stage 211 acquired from the imaging information (step S207).

When it is determined that the upper end 33 of each lift pin 31 has not come into contact with the substrate W (step S207: NO), the controller 90 proceeds to step S208. In step S208, the controller 90 counts (increments) the number of executions of the second adjustment operation of raising each lift pin 31 and determines whether or not the count has reached a preset count threshold or more. When the count has reached the count threshold or more (step S208: YES), the controller 90 notifies an error in the lifter 30 and terminates the current control position setting method.

In the meantime, when the count is less than the count threshold (step S208: NO), the controller 90 returns to step S204 and raises the lift pin 31 again by the second pitch. The controller 90 repeats the above processing flow of steps S204 to S208 until each lift pin 31 comes into contact with the substrate W. Then, when it is determined that the upper end 33 of each lift pin 31 has come into contact with the substrate W (step S207: YES), the controller 90 proceeds to step S209.

In step S209, the controller 90 sets the current position of each lift pin 31 as the touch position PT for each lift pin 31.

Then, the controller 90 calculates the unload position PU, which is the control position, using the current position (touch position PT) of each lift pin 31 (step S210). The unload position PU is calculated, for example, by adding a preset unload position adjustment value to the current position of each lift pin 31. This unload position adjustment value is a value (positive value) in the vertical upward direction from the current position, and is set to an appropriate interval (e.g., 0.6 mm) within the above range of approximately 0.4 mm to 1.0 mm. The unload position adjustment value may be arbitrarily set by the user.

Subsequently, the controller 90 uses the calculated unload position PU to calculate the load position PL, which is the control position (step S211). The load position PL is calculated, for example, by adding a preset load position adjustment value to the unload position PU. The load position adjustment value is a value (negative value) in the vertical downward direction from the unload position PU, and is set to a lower value (e.g., −1.0 mm) than the touch position PT within the range of approximately −0.8 mm to −1.3 mm. The load position adjustment value may also be arbitrarily set by the user.

After step S111, the controller 90 sets the calculated touch position PT, load position PL, and unload position PU as parameters for use in the transfer of the substrate W from that slot, and then retreats each lift pin 31 to the standby position PS (step S212). This terminates the second adjustment process S4. The controller 90 displays the touch position PT in the touch position display section 103 of the screen information 100, as illustrated in FIG. 6, based on the setting of the touch position PT. Similarly, the controller 90 displays the load position PL in the current value display column 102*b* of the load position display section 102 based on the setting of the load position PL. Furthermore, the controller 90 displays the unload position PU in the current value display column 104*b* of the unload position display section 104 based on the setting of the unload position PU.

Returning to FIG. 5, after the second adjustment process S4, the controller 90 performs the slot determination process S5 to determine whether or not there is any other slot where the control position needs to be adjusted. When there is another slot requiring the adjustment of the control position, the controller 90 returns to the first adjustment process S3, repeating the subsequent same processing. Then, for example, when adjusting the control positions for all six slots, the controller 90 performs the first adjustment process S3 and second adjustment process S4 on all the slots. When there is no slot requiring the adjustment of the control position in the slot determination process S5, the controller 90 proceeds to the next error checking process S6.

In the error check process S6, the controller 90 calculates the difference between the maximum and minimum values of the touch positions PT for each slot, and then determines whether or not the calculated difference falls within a preset allowable range. The calculated difference and determination results are displayed in the touch position status column 103*b*. Further, when the difference does not fall within the allowable range, the controller 90 notifies the user of information indicating that an abnormality has occurred in each stage 211 through the screen information 100, etc. This allows the user to perform necessary maintenance, etc. on the rotary table 21 of the substrate processing apparatus 1 at an early stage. The error checking process S6 is not limited to being executed after setting the control positions for all the slots, but may be executed after setting the control positions for two or more slots (e.g., first and second slots). This enables early recognition of differences in the touch positions PT between the first slot and the second slot.

As described above, the substrate processing apparatus 1 may automatically set the control positions for each slots (stage 211). Here, in the conventional substrate processing apparatus, when setting the control positions for each slot, the user visually confirmed whether or not the substrate W and the lifter 30 were in contact based on images captured by a camera, and this confirmation was repeated for each slot. Therefore, a significant time was required for setting the control positions for each slot. In contrast, the substrate processing apparatus 1 according to the embodiment may achieve enhanced operational efficiency by performing the first adjustment operation and the second adjustment operation for the lifter 30 and determining the contact between the lifter 30 and the substrate W through the control position setting method described above. In particular, the substrate processing apparatus 1 may achieve a significant reduction in time when setting the control positions for all the plurality of (six) slots.

Figure 9:
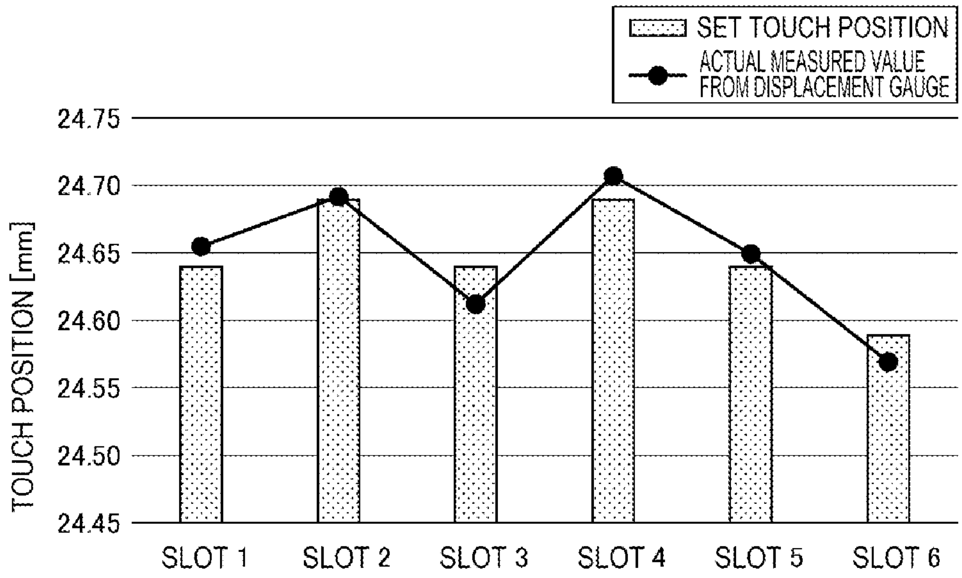
FIG. 9 is a graph illustrating touch positions set by the control position setting method and actual measured values of a placement surface from a displacement gauge.

FIG. 9 is a graph illustrating touch positions set by the control position setting method and actual measured values of the placement surface 211*s* using a displacement gauge. In FIG. 9, the bar graph represents the touch positions for each slot set by the control position setting method, while the line graph represents the actual measured values for each slot from a displacement gauge. The actual measured values from the displacement gauge were obtained by fixing the displacement gauge to the main body 111 through a jig with the ceiling plate 112 of the vacuum container 11 removed, and measuring the height position of the placement surface 211*s* of each stage 211 using the displacement gauge.

As illustrated in FIG. 9, in the substrate processing apparatus 1, the height positions of the placement surfaces 211*s* of the respective stages 211 differ from each other. However, the touch positions set by the control position setting method and the actual measured values from the displacement gauge vary approximately in the same manner. Then, when calculating the difference between the set touch positions for each slot and the actual measured values from the displacement gauge, the error was converged within the range of 0.03 mm. In other words, the control positions acquired by executing the control position setting method may be considered to be almost identical to the actual measured values from the displacement gauge. Therefore, it can be seen that the control positions for each slot may be set very precisely by implementing the control position setting method according to the present embodiment.

It is needless to say that the substrate processing apparatus 1 and the control position setting method according to the present disclosure are not limited to the above-described embodiments and may take various modifications. For example, the above embodiment has exemplified the substrate processing apparatus 1 in which each stage 211 revolves around the rotating shaft 23 of the rotary table 21 and each stage 211 itself rotates. However, the substrate processing apparatus 1 is not limited to this configuration but may have a configuration in which each stage 211 does not rotate and only the rotary table 21 rotates (i.e. a configuration having only a revolution mechanism without a rotation mechanism).

Further, the substrate processing apparatus 1 may also perform the maintenance of the rotary table 21 using the touch position PT acquired by the control position setting method. In other words, the touch position PT is equivalent to the position (height position) of each surface 211*s* of the rotary table 21. Therefore, for example, when adjusting the height of the rotary table 21 for the replacement of the rotary table 21, the user compares the touch position PT in the screen information 100 before and after the replacement of the rotary table 21. This allows the user to easily and precisely adjust the height of the rotary table 21, ensuring that the position of each placement surface 211*s* after the replacement roughly matches the position before the replacement.

SUMMARY

The technical ideas and effects of the present disclosure described in the above embodiment will be described below.

A substrate processing apparatus 1 according to a first aspect of the present disclosure includes a vacuum container 11, a rotary table 21 rotatably provided within the vacuum container 11, a stage 211 that places a substrate W thereon at a position away from a rotation center of the rotary table 21, a lifter 30 that is displaced relative to the stage 211 to raise or lower the substrate W, and a controller 90 that controls an operation of the lifter 30, wherein the controller 90 is configured to automatically set a control position in the operation of the lifter 30, and wherein, in setting of the control position, the controller 90 controls (A) repeatedly raising the lifter 30 by a first pitch and then determining whether or not the lifter 30 has come into contact with the substrate W placed on the stage 211, thereby detecting a position where the lifter 30 comes into contact with the substrate W and setting a next position (detailed adjustment start position) based on the detected position and (B) repeatedly raising the lifter 30 from the next position by a second pitch shorter than the first pitch and then determining whether or not the lifter 30 has come into contact with the substrate W placed on the stage 211, thereby detecting a touch position PT where the lifter 30 comes into contact with the substrate W and calculating the control position based on the touch position PT.

According to the above, the substrate processing apparatus 1 may automatically set the control position, thereby reducing the user's burden in setting the control position of the lifter 30. In particular, the substrate processing apparatus 1 may precisely set the control position of the lifter 30 in order to detect the touch position PT of the stage 211 with the short pitch in (B). Further, by obtaining the detailed adjustment start position through the driving of the lifter with the first pitch in (A), the substrate processing apparatus 1 may effectively reduce the number of times (B) is executed, leading to improved operational efficiency. Therefore, even when replacing the stage 211 during maintenance or the like, it is possible to efficiently set the control position of the lifter 30 to start substrate processing. For example, compared to the task of determining the touch position by visually confirming imaging information from the camera 60, it is possible to shorten the operation time to less than half and to significantly reduce the user's burden.

Further, the control position is a position where a speed of the lifter 30 is switched when the lifter 30 paces the supported substrate W onto the stage 211 or when the lifter 30 lifts the substrate from the stage 211. This allows the substrate processing apparatus 1 to smoothly acquire the control position required for speed control when raising or lowering the lifter 30.

Further, the control position includes a load position PL set vertically below the substrate W placed on the stage 211 and an unload position PU set vertically above the substrate W placed on the stage 211. This allows the substrate processing apparatus 1 to stably raise or lower the substrate W based on the set load position PL and unload position PU.

Further, the controller 90 calculates the unload position PU by adding an unload position adjustment value to the touch position PT detected in (B), and calculates the load position PL by further adding a load position adjustment value to the calculated unload position PU. This allows the controller 90 to easily calculate the load position PL and unload position PU, which are relative positions to the touch position PT.

Further, the next position (detailed adjustment start position) is a position obtained by adding an offset value in a lowering direction to the position where the lifter 30 comes into contact with the substrate W in (A). This allows the substrate processing apparatus 1 to smoothly obtain the next position in (B) to start (B).

Further, the substrate processing apparatus further includes an imaging device (camera 60) that captures an image of the substrate W placed on the stage 211 from vertically above the lifter 30, and wherein in (A), the controller 90 captures an image of the substrate W using the imaging device each time the lifter 30 is raised by the first pitch and determines whether or not the lifter 30 has come into contact with the substrate W based on resulting imaging information, and in (B), the controller 90 captures an image of the substrate using the imaging device each time the lifter is raised by the second pitch, and determines whether or not the lifter 30 has come into contact with the substrate based on resulting imaging information. This allows the substrate processing apparatus 1 to effectively determine the contact between the substrate W and the lifter 30.

Further, the controller 90 determines whether or not the lifter 30 has come into contact with the substrate W based on a change in a shadow of an outer edge of the substrate W in the imaging information when the substrate W is lifted from the stage 211. As such, by utilizing the shadow of the outer edge of the substrate W, the controller 90 may determine the contact between the substrate W and the lifter 30 with sufficiently high precision.

Further, in both (A) and (B), the controller 90 counts the number of times an operation of raising the lifter 30 for each pitch is executed, and continues to raise the lifter when the execution count is less than a count threshold, but notifies an abnormality if the execution count is equal to or greater than the count threshold. This allows notifying the user of an error in which the lift pin 31 fails to come into contact with the substrate W due to an abnormality in the stage 211, allowing the user to take a necessary action promptly.

Further, the rotary table 21 includes a plurality of stages 211 and is configured to rotate a plurality of substrates W, and the controller 90 sets the touch position PT and the control position by performing (A) and (B) for the plurality of stages 211, calculates a difference in the set touch position PT between the plurality of stages 211, determines a normality or abnormality in the plurality of stages 211 based on the calculated difference, and notifies the user when the abnormality is detected in the plurality of stages. This allows the substrate processing apparatus 1 to easily compare the height positions of the plurality of stages 211.

A second aspect of the present disclosure relates to a control position setting method of setting a control position in an operation of a lifter 30 in a substrate processing apparatus 1 comprising a vacuum container 11, a rotary table 21 rotatably provided within the vacuum container 11, a stage 211 that places a substrate W thereon at a position away from a rotation center of the rotary table 21, and the lifter 30 that is displaced relative to the stage 211 to raise or lower the substrate W, the method comprising: (A) repeatedly raising the lifter 30 by a first pitch and then determining whether or not the lifter 30 has come into contact with the substrate W placed on the stage 211, thereby detecting a position where the lifter 30 comes into contact with the substrate W and setting a next position (detailed adjustment start position) based on the detected position; and (B) repeatedly raising the lifter 30 from the next position by a second pitch shorter than the first pitch and then determining whether or not the lifter 30 has come into contact with the substrate W placed on the stage 211, thereby detecting a touch position PT where the lifter 30 comes into contact with the substrate and calculating the control position based on the touch position PT. Even in this case, the control position setting method allows for the accurate setting of the control position of the lifter 30 and improves the operational efficiency.

According to an aspect, it is possible to precisely set the control position of a lifter and to achieve an enhanced efficiency in operation.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:

a vacuum container;

a rotary table rotatably provided within the vacuum container;

a stage configured to place a substrate thereon at a position away from a rotation center of the rotary table;

a lifter displaced relative to the stage and configured to raise or lower the substrate; and a controller configured to control an operation of the lifter, wherein the controller is configured to automatically set a control position in the operation of the lifter, and in setting of the control position, the controller controls a process comprising:

(A) repeatedly raising the lifter by a first pitch and then determining that the lifter has come into contact with the substrate placed on the stage, thereby detecting a first touch position where the lifter comes into contact with the substrate and setting a next position by adding an offset value in a lowering direction to the first touch position; and (B) lowering the lifter to the next position and then repeatedly raising the lifter from the next position by a second pitch shorter than the first pitch and then determining that the lifter has come into contact with the substrate placed on the stage, thereby detecting a second touch position where the lifter comes into contact with the substrate and calculating the control position based on the second touch position.

2. The substrate processing apparatus according to claim 1, wherein the control position is a position where a speed of the lifter is switched when the lifter places the supported substrate onto the stage or when the lifter lifts the substrate from the stage.

3. The substrate processing apparatus according to claim 2, wherein the control position includes a load position set vertically below the substrate placed on the stage and an unload position set vertically above the substrate placed on the stage.

4. The substrate processing apparatus according to claim 3, wherein the controller calculates the unload position by adding an unload position adjustment value to the second touch position detected in (B), and calculates the load position by further adding a load position adjustment value to the calculated unload position.

5. The substrate processing apparatus according to claim 1, wherein the next position is a position obtained by adding an offset value in a lowering direction to the first touch position detected in (A).

6. The substrate processing apparatus according to claim 1, further comprising:

a camera configured to capture an image of the substrate placed on the stage from vertically above the lifter, wherein, in (A), the controller captures an image of the substrate using the camera each time the lifter is raised by the first pitch, and determines whether or not the lifter has come into contact with the substrate based on resulting imaging information, and wherein, in (B), the controller captures an image of the substrate using the camera each time the lifter is raised by the second pitch, and determines whether or not the lifter has come into contact with the substrate based on resulting imaging information.

7. The substrate processing apparatus according to claim 6, wherein the controller determines whether or not the lifter has come into contact with the substrate based on a change in a shadow of an outer edge of the substrate in the imaging information when the substrate is lifted from the stage.

8. The substrate processing apparatus according to claim 1, wherein, in both (A) and (B), the controller counts the number of times an operation of raising the lifter for each pitch is executed, and continues to raise the lifter when the execution count is less than a count threshold, but notifies an abnormality when the execution count is equal to or greater than the count threshold.

9. The substrate processing apparatus according to claim 1, wherein the rotary table includes a plurality of stages and is configured to rotate a plurality of substrates, and wherein the controller sets the second touch position and the control position by performing (A) and (B) for the plurality of stages, calculates a difference in the set second touch position between the plurality of stages, determines a normality or abnormality in the plurality of stages based on the calculated difference, and notifies a user when the abnormality is detected in the plurality of stages.

10. A control position setting method of setting a control position in an operation of a lifter in a substrate processing apparatus comprising:

a vacuum container;

a rotary table rotatably provided within the vacuum container;

a stage configured to place a substrate thereon at a position away from a rotation center of the rotary table; and the lifter displaced relative to the stage and configured to raise or lower the substrate, the method comprising:

(A) repeatedly raising the lifter by a first pitch and then determining that the lifter has come into contact with the substrate placed on the stage, thereby detecting a first touch position where the lifter comes into contact with the substrate and setting a next position by adding an offset value in a lowering direction to the first touch position; and (B) lowering the lifter to the next position and then repeatedly raising the lifter from the next position by a second pitch shorter than the first pitch and then determining that the lifter has come into contact with the substrate placed on the stage, thereby detecting a second touch position where the lifter comes into contact with the substrate and calculating the control position based on the second touch position.

* * * * *